(12) United States Patent
Kwan et al.

(10) Patent No.: US 6,852,989 B2
(45) Date of Patent: *Feb. 8, 2005

(54) POSITIONING SYSTEM FOR USE IN LITHOGRAPHIC APPARATUS

(75) Inventors: Yim Bun P. Kwan, Eindhoven (NL); Serge F. C. L. Wetzels, Eindhoven (NL); Gerjan P. Veldhuis, Vinkel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/648,270

(22) Filed: Aug. 27, 2003

(65) Prior Publication Data

US 2004/0036035 A1 Feb. 26, 2004

Related U.S. Application Data

(63) Continuation of application No. 09/725,299, filed on Nov. 29, 2000, now Pat. No. 6,635,887.

(30) Foreign Application Priority Data

Dec. 1, 1999 (EP) .............................................. 99204051

(51) Int. Cl.[7] .......................... G01N 23/00; A61N 5/00; G03B 27/42; B23Q 1/25
(52) U.S. Cl. ................................ 250/491.1; 250/492.3; 355/53; 269/73
(58) Field of Search .......................... 250/491.1, 492.3, 250/492.2; 355/53; 269/73; 356/500

(56) References Cited

U.S. PATENT DOCUMENTS

| | | | |
|---|---|---|---|
| 4,628,238 A | 12/1986 | Smulders et al. | ........... 318/653 |
| 4,655,594 A | * 4/1987 | Wittekoek et al. | .......... 356/500 |
| 5,150,153 A | 9/1992 | Franken et al. | ................ 355/53 |
| 5,163,651 A | 11/1992 | Matsumoto | .................. 248/425 |
| 5,528,118 A | 6/1996 | Lee | ........................ 318/568.17 |
| 5,623,853 A | * 4/1997 | Novak et al. | ............. 74/490.09 |
| 5,760,564 A | 6/1998 | Novak | |
| 5,815,246 A | * 9/1998 | Sperling et al. | ............... 355/53 |
| 5,874,820 A | 2/1999 | Lee | |
| 5,969,441 A | 10/1999 | Loopstra et al. | ............... 310/12 |
| 6,134,981 A | 10/2000 | Novak et al. | ............. 74/490.09 |
| 6,196,138 B1 | 3/2001 | Sakai et al. | .................... 108/22 |
| 6,262,796 B1 | 7/2001 | Loopstra et al. | .............. 355/53 |
| 6,271,640 B1 | 8/2001 | Lee | ........................... 318/560 |
| 6,320,649 B1 | 11/2001 | Miyajima et al. | ............. 355/72 |
| 6,467,960 B1 | 10/2002 | Watson et al. | ................ 384/12 |
| 6,635,887 B2 | * 10/2003 | Kwan et al. | ............. 250/491.1 |

* cited by examiner

Primary Examiner—John R. Lee
Assistant Examiner—Kalimah Fernandez
(74) Attorney, Agent, or Firm—Pillsbury Winthrop LLP (57) ABSTRACT

A positioning system, such as may be used to position a moveable object table in three degrees of freedom. More particularly, the invention relates to the use of the positioning system in a lithographic projection apparatus including an illumination system for supplying a projection beam of radiation, a first object table for holding a mask, a second, movable object table for holding a substrate, and a projection system for imaging an irradiated portion of the mask onto a target portion of the substrate.

25 Claims, 6 Drawing Sheets

POSITIONING SYSTEM FOR USE IN LITHOGRAPHIC APPARATUS

This application is a Continuation of U.S. application Ser. No. 09/725,299, filed Nov. 29, 2000 now U.S. Pat. No. 6,635,887, which claims priority from European Patent application No. 99204051.9, filed Dec. 1, 1999, the contents of which are incorporated herein by reference.

BACKGROUND OF THE INVENTION

1. Field of the Invention

The present invention relates to a positioning system, such as may be used to position a moveable object table in three degrees of freedom. More particularly, the invention relates to the use of the positioning system in a lithographic projection apparatus comprising:

an illumination system for supplying a projection beam of radiation;

a first object table for holding a mask;

a second, movable object table for holding a substrate; and a projection system for imaging an irradiated portion of the mask onto a target portion of the substrate.

2. Description of the Related Art

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The illumination system may also include elements operating according to any of these principles for directing, shaping or controlling the projection beam of radiation. In addition, the first and second object tables may be referred to as the "mask table" and the "substrate table", respectively.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target portion (comprising one or more dies) on a substrate (silicon wafer) which has been coated with a layer of radiation-sensitive material (resist). In general, a single substrate will contain a whole network of target portions which are successively irradiated via the mask, one at a time. In one type of lithographic projection apparatus, each target portion is irradiated by exposing the entire mask pattern onto the target portion at once; such an apparatus is commonly referred to as a wafer stepper. In an alternative apparatus—which is commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned from International Patent Application WO 97/33205.

In general, apparatus of this type contained a single first object (mask) table and a single second object (substrate) table. However, machines are becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial metrology steps on the new substrate, and then stand by to transfer this new substrate to the exposure position underneath the projection system as soon as exposure of the first substrate is completed, whence the cycle repeats itself; in this manner, it is possible to achieve a substantially increased machine throughout, which in turn improves the cost of ownership of the machine.

In a known lithographic apparatus, the drive unit of the positioning mechanism for the substrate table comprises two linear Y-motors each of which comprises a stator which extends parallel to the Y-direction and is secured to a base of the positioning mechanism, and a translator (Y-slide) which can be moved along the stator. The base is secured to the frame of the lithographic device. The drive unit further comprises a linear X-motor which includes a stator which extends parallel to the X-direction, and a translator (X-slide) which can be moved along the stator. The stator is mounted on an X-beam which is secured, near its respective ends, to the translators of the linear Y-motors. The arrangement is therefore H-shaped, with the two Y-motors forming the "uprights" and the X-motor forming the "cross-piece", and this arrangement is often referred to as an H-drive or gantry. U.S. Pat. No. 4,655,594 describes such an arrangement using hydraulic linear motors and mentions the possibility of using electric linear motors.

The driven object, in this case the substrate table, is provided with a so-called air foot. The air foot comprises a gas bearing by means of which the substrate table is supported so as to be movable over a guide surface of the base extending at right angles to the Z-direction.

To enable such an H-drive to actively control the yaw (rotation about the Z-axis) of the driven object, the two linear Y-motors are driven independently and the X-beam is usually mounted to the Y-translators by pivots (though U.S. Pat. No. 4,655,594 suggests that a rigid joint can be used). However, in this arrangement, very high loads are experienced at the pivots between the X-beam and the Y-slides. The pivots have to carry not only thrust reactions from the X-motor through the side bearings to the surrounding structure, but also the Y-motor actuation forces. This places very high demands on the elastic hinges commonly used for such pivots, especially when the yaw motion range is relatively large.

Further problems are encountered as the pivots on the X-beam cannot always be positioned on the line of force for the Y-motors, so that the side thrust bearing of the Y-slide has to accommodate both the X-reaction forces as well as the moment created by the Y-actuator forces and the offset between the pivots and the Y line of force. The resulting high loads in the known arrangement therefore leads to a design which can be cumbersome and heavy.

SUMMARY OF THE INVENTION

An object of the present invention is to provide an improved positioning apparatus which avoids or alleviates the problems of known positioning apparatus.

According to the present invention there is provided a lithographic projection apparatus for imaging of a mask pattern in a mask onto a substrate provided with a radiation sensitive layer, the apparatus including:

an illumination system for supplying a projection beam of radiation;

a first object table for holding a mask;

a second object table for holding a substrate;

a projection system for imaging irradiated portions of the mask onto target portions of the substrate;

a positioning system for positioning at least one of said object tables in a plane, said positioning system comprising:

first and second generally parallel side-beams having respective first and second sliders mounted thereon;

first and second motor means for moving said first and second sliders longitudinally of their respective side beams;

a cross-beam mounted near first and second ends thereof to said first and second sliders respectively and having a third slider mounted thereon, said cross-beam and said first and second sliders being mounted together so as to form a body that is substantially rigid in translation in said plane and in rotation about an axis normal to said plane;

third motor means for moving said third slider longitudinally of said cross-beam, said third slider having an object holder for holding said one object table; characterized by:

a thrust bearing pivotally mounted to said first slider for transmitting forces in said plane and perpendicular to said first side beam between said cross-beam and said first side beam.

By mounting the cross-beam (X-beam) and first and second (Y-) sliders rigidly against rotation about an axis (the Z-axis) normal to the plane of movement of the moveable object (XY-plane) as well as against translations in that plane, the X-beam and Y-sliders form a rigid body in the XY-plane. This eliminates the need for pivots capable of transmitting the Y actuation forces and X reaction forces to and from the X-beam and simplifies the construction of the apparatus.

Further, the thrust bearing pivotally mounted between the slider and side beam thereby transfers forces in the (nominal) X-direction to the side beam without experiencing any forces in the Y-direction, simplifying the construction of the bearing and pivot. There is also no "cross talk" between X and Y forces; the transfer of the X-direction forces does not give rise to any Y-direction forces.

The motors driving the first and second (Y-) sliders may be linear motors having a stator mounted on the beam and an armature in the slider. The motors may be arranged to provide substantially constant characteristics independent of the angular (yaw) position of the Y-sliders, for example by having an armature of magnets arranged in a herring-bone pattern, or the driving software or hardware may be arranged to compensate for yaw-dependent properties of the motor.

Damage protection can advantageously be provided by a yaw and/or a yaw rate sensor and cutoff arranged to cut power to the motors in the event of an excessive yaw or rate of yaw of the X-beam. Resilient buffers arranged to contact the Y-beams in the event of out-of-range yaw motions can provide additional protection.

According to a yet further aspect of the invention there is provided a method of manufacturing a device using a lithographic projection apparatus comprising:

a radiation system for supplying a projection beam of radiation;

a first movable object table provided with a mask holder for holding a mask;

a second movable object table provided with a substrate holder for holding a substrate; and a projection system for imaging irradiated portions of the mask onto target portions of the substrate; the method comprising the steps of:

providing a mask bearing a pattern to said first moveable object table;

providing a substrate provided with a radiation-sensitive layer to said second movable object table;

irradiating portions of the mask and imaging said irradiated portions of the mask onto said target portions of said substrate; characterized in that:

a positioning apparatus used to position one of said movable object tables prior to or during said steps of irradiating and imaging comprises:

first and second generally parallel side-beams having respective first and second sliders mounted thereon;

first and second motor means for moving said first and second sliders longitudinally of their respective side beams;

a cross-beam mounted near first and second ends thereof to said first and second sliders respectively and having a third slider mounted thereon, said cross-beam and said first and second sliders being mounted together so as to form a body that is substantially rigid in translation in said plane and in rotation about an axis normal to said plane;

third motor means for moving said third slider longitudinally of said cross-beam, said third slider having an object holder for holding said moveable object; characterized by:

a thrust bearing pivotally mounted to said first slider for transmitting forces in said plane and perpendicular to said first side beam between said cross-beam and said first side beam.

In a manufacturing process using a lithographic projection apparatus according to the invention a pattern in a mask is imaged onto a substrate which is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion" or "exposure area", respectively.

In the present document, the terms radiation and projection beam are used to encompass all types of electromagnetic radiation or particle flux, including, but not limited to, ultraviolet radiation (e.g. with a wavelength of 365, 248, 193, 157 or 126 nm), EUV, X-rays, electrons and ions.

BRIEF DESCRIPTION OF THE DRAWINGS

The present invention will be described below with reference to exemplary embodiments and the accompanying schematic drawings, in which.

In the drawings, like reference numerals indicate like parts.

DETAILED DESCRIPTION OF THE INVENTION

Embodiment 1

Figure 1:
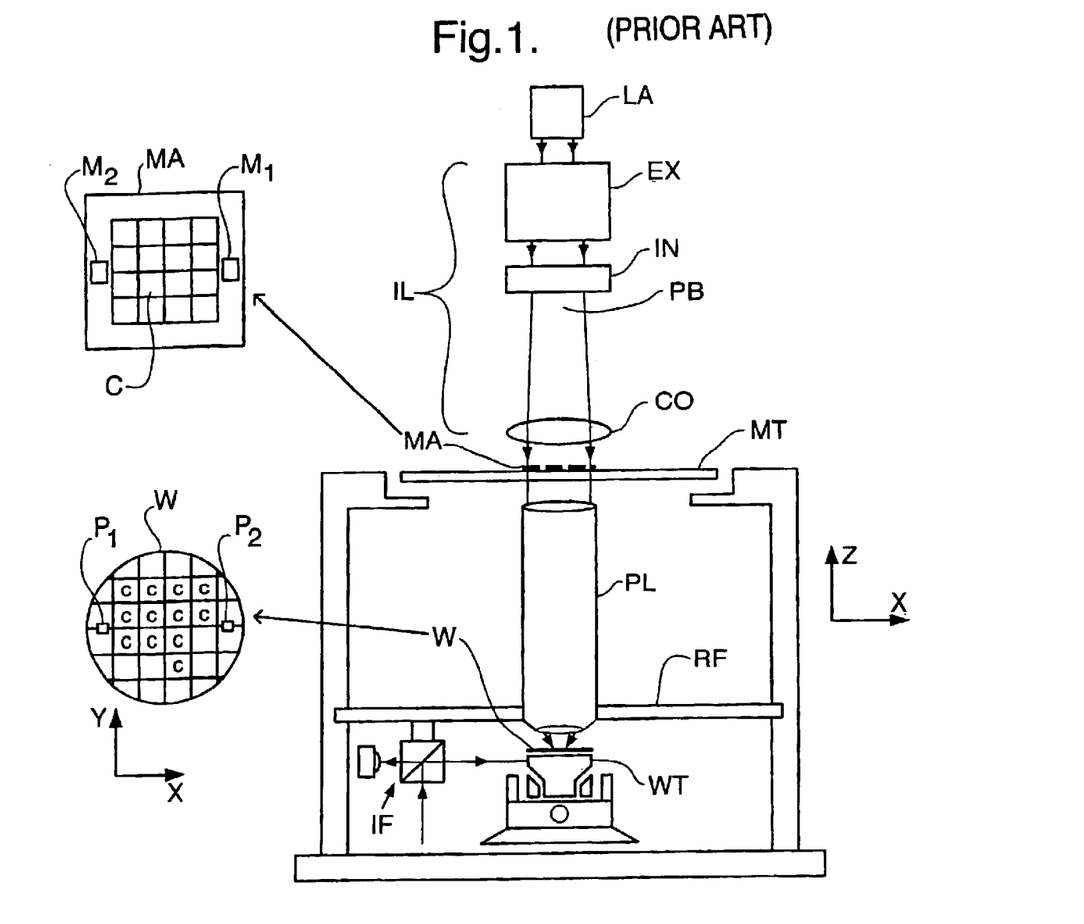
FIG. 1 depicts a lithographic projection apparatus according to a first embodiment of the invention.

FIG. 1 schematically depicts a lithographic projection apparatus according to the invention. The apparatus comprises:

a radiation system LA, IL for supplying a projection beam PB of radiation (e.g. UV or EUV radiation);

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive or catadioptric system, a mirror group or an array of field deflectors) for imaging an irradiated portion of the mask MA onto a target portion C of the substrate W.

As here depicted, the apparatus is of a transmissive type (i.e. has a transmissive mask). However, in general, it may also be of a reflective type, for example.

In the example depicted here, the radiation system comprises a source LA (e.g. a Hg lamp, excimer laser, a laser or discharge plasma source, an undulator provided around the path of an electron beam in a storage ring or synchrotron, or an electron or ion beam source) which produces a beam of radiation. This beam is passed along various optical components comprised in the illumination system IL,—e.g. beam shaping optics Ex, an integrator IN and a condenser CO—so that the resultant beam PB has a desired shape and intensity distribution.

The beam PB subsequently intercepts the mask MA which is held in a mask holder on a mask table MT. Having passed through the mask MA, the beam PB passes through the lens PL, which focuses the beam PB onto a target portion C of the substrate W. With the aid of the interferometric displacement measuring means IF, the substrate table WT can be moved accurately by the second positioning means, e.g. so as to position different target portions C in the path of the beam PB. Similarly, the first positioning means can be used with the aid of interferometric displacement measuring means to accurately position the mask MA with respect to the path of the beam PB, e.g. after mechanical retrieval of the mask MA from a mask library. In general, movement of the object tables MT, WT will be realized with the aid of a long stroke module (course positioning) and a short stroke module (fine positioning), which are not explicitly depicted in FIG. 1.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
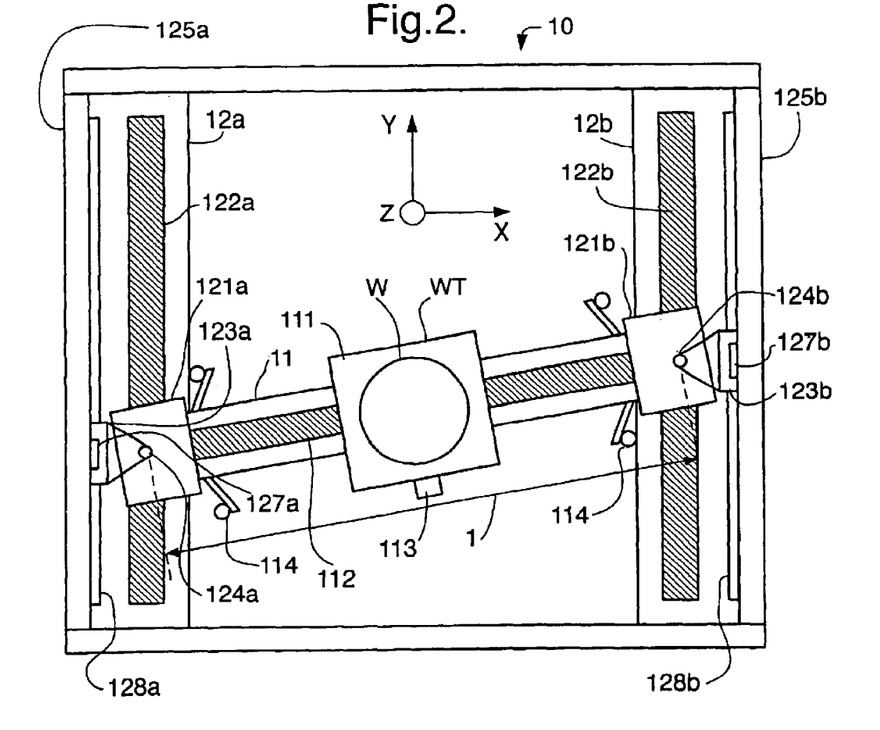
FIG. 2 is a plan view of the wafer stage, comprising the substrate table and drive unit, of the apparatus of FIG. 1.

FIG. 2 shows the wafer stage of the lithographic apparatus of the first embodiment in plan. The wafer W is mounted on substrate (wafer) table WT which is positioned by a coarse positioning mechanism (long stroke module) generally indicated as 10. The coarse positioning mechanism has a generally H-shaped configuration in which the cross bar is formed by X-beam 11 and the uprights by Y-beams 12a, 12b. These beams are so called because they are generally parallel to the orthogonal X and Y axes of a reference coordinate system defined for the apparatus.

It should be noted that the wafer table WT may incorporate further positioning systems cascaded to the course positioning mechanism to accurately control the position of the wafer in any or all of the six possible degrees of freedom. The working of such a fine positioning system is not particularly relevant to the present invention and a description thereof is therefore omitted for the sake of brevity.

Wafer table WT is supported on X-beam 11 by X-slider 111 which includes a linear motor acting against magnet track 112 enabling wafer table WT to be displaced linearly along X-beam 11. In alternative embodiments of the invention, wafer table WT may simply be driven in X, Y and Rz by X-slider 111 and supported separately, e.g. by an air-foot over a guide surface of the machine frame or the X-beam 11, in Z, Rx and Ry. X-beam 11 is mounted near its ends to respective Y-sliders 121a, 121b, which similarly to X-slider 111, include linear motors acting against magnet tracks 122a, 122b enabling the beam to be displaced along the Y-direction.

Displacement of X-slider 111 longitudinally of X-beam 11 and displacement of X-beam 11 in the Y-direction allows wafer table WT to be positioned coarsely in the X-Y plane. Independent control of Y-sliders 121a, 121b allows the rotational position of wafer table WT about the Z-axis (yaw) to be controlled within a certain range.

According to the present invention, the X-beam is coupled to Y-sliders 121a, 121b rigidly in at least the X and Y directions and against rotation about the Z axis, Rz, so as to form a rigid body in the X-Y plane. This eliminates the need for Rz pivots between X-beam 11 and Y-sliders 121a, 121b and ensures direct coupling of the Y-direction actuation forces to X-beam 11. As described further below, the coupling of the X-beam to the Y-sliders may also be rigid in Z and one side may also be rigid in Rx. Preferably neither side is coupled rigidly in Ry.

Figure 3:
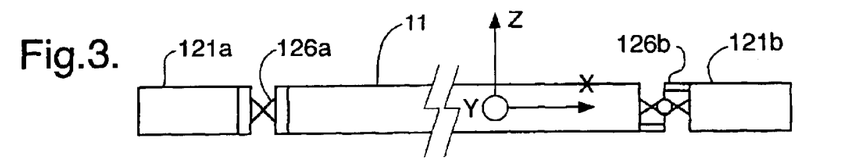
FIG. 3 is an enlarged side view of the X-beam of the wafer stage of FIG. 2.

X-slider 111 is box shaped and surrounds X-beam 11. Alternatively it may take the form of an inverted U placed over the top of the X-beam 11. The X-slider 111 is supported by opposed-pad air (gas) bearings so as to be displaceable longitudinally of X-beam 11 (in the nominal X-direction) substantially without friction but is restrained relative to the X-beam so that it cannot move in the Y- and Z-directions, nor yaw. X-beam 11 itself is a multi-cell hollow beam with at least three longitudinally extending cells, the middle one of which is asymmetrically offset in the Z-direction to accommodate the stationary part, e.g. magnet track 112 or a coil assembly, of the X-motor so that the driving force of the X-motor is as close as possible to the center of gravity of the moving mass. X-slider 111 and X-beam 11 can be made of a technical ceramic material, such as $Al_2O_3$, SiC, SiSiC, CSiC, etc., to ensure they have relatively high Eigenfrequencies.

Reaction forces in the nominal X-direction, i.e. the X component of reaction forces generated by displacement of X-slider 111 and wafer table WT along X-beam 11, are transferred to Y-beam 12a. This is effected by side thrust bearing 123a which is connected to Y-slider 121a via pivot 124a and acts against upstanding wall 125a provided on the outside edge of Y-beam 12a. The side thrust bearing 123a may comprise a single-sided aerostatic thrust bearing with a magnetic or vacuum pre-load of magnitude sufficiently larger, including safety factors, than the maximum reaction force expected in use of the positioning mechanism. An alternative would be a double-sided (opposed pad) air bearing acting on opposite faces of wall 125a.

A second side bearing 123b is provided on Y-slider 121b to mount an encoder reading head 127b, which is discussed further below. Side bearing 123b is mounted to Y-slider 121b via pivot 124b which includes a leaf spring arrangement or linear bearing, such as a cross-roller guideway, to give freedom of movement in the X-direction. This accommodates the reduction in effective length of X-beam 11 in the X-direction as yaw angle increases (so-called cosine foreshortening) and ensures that side bearing 123b remains in contact with wall 125b.

Figure 8:
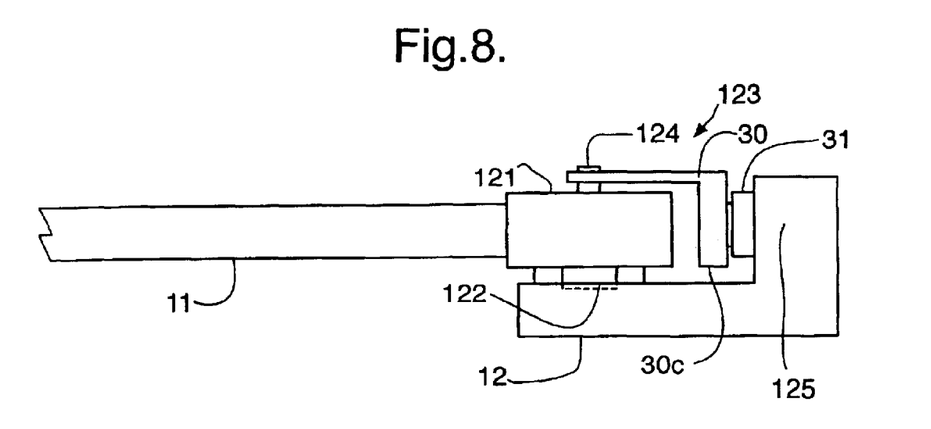
FIG. 8 is an enlarged side view of a part of the wafer stage of FIG. 2.
Figure 9:
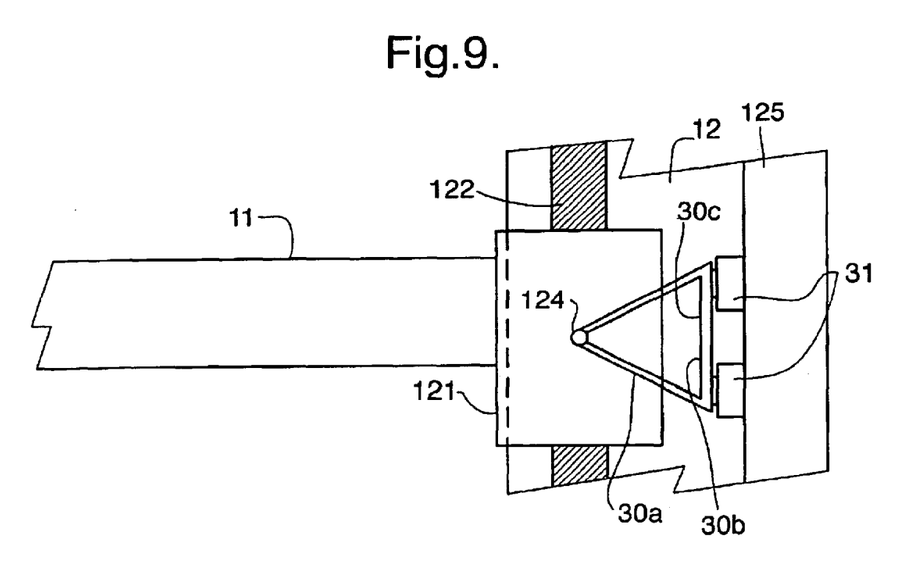
FIG. 9 is a plan view of the part of the wafer stage of FIG. 8.

As shown in FIG. 8, which is a side view of one end of X-beam 11, Y-slider 121 and side bearing 123, and FIG. 9, which is a plan view of those components, side bearing 123 comprises a yoke member 30 which is mounted to Y-slider 121 via pivot 124 and carries bearings 31. Yoke member 30 comprises spars 30a, 30b which extend horizontally from the upper corners of plate 30c to pivot 124. Plate 30c extends vertically downwards between Y-slider 121 and wall 125 attached to Y-beam 12 and carries bearings 31 which act against wall 125. The center line of bearings 31 is thereby arranged to be in line with the X-reaction forces generated by translations of the X-slider (not shown) along X-beam 11.

Because X-beam 11 and Y sliders 121a, 121b form a rigid body in the XY plane, if X-beam 11 is displaced from parallel to the X axis to effect yaw positioning of wafer table WT, the linear motors of Y-sliders 121a and 121b will be correspondingly rotated relative to their magnet tracks 122a, 122b. If the Y-motors are of a conventional type with iron armatures and a simple slanted arrangement of magnets in the track, the resultant changes in motor constant and cogging force can be compensated for in software. Alternatively, multi-phase Lorentz-type ironless linear motors can be used which do not result in significant changes in motor performance with yaw angle. A further alternative is to use magnet tracks in which the magnets form a herring-bone pattern. In such an arrangement, the changes in motor constant and cogging force on one side of the herring-bone almost exactly cancel those on the opposite side, resulting in a motor assembly substantially insensitive to yaw.

Figure 4:
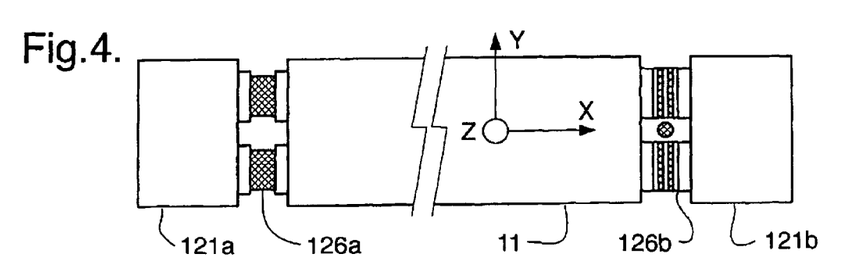
FIG. 4 is an enlarged plan view of the X-beam of the wafer stage of FIG. 2.

As shown in FIG. 4, X-beam 11 is connected to Y-sliders 121a, 121b by joints 126a, 126b. Joints 126a, 126b are arranged to provide freedom for roll (rotation Ry) between X-beam 11 and Y-sliders 121a, 121b in order to accommodate any deviations from parallel in the upper bearing surfaces of Y-beams 12a, 12b. Such deviations may occur because of a height difference or misalignment between the two beams. The angular range of the required freedom is limited and can be provided by elastic flexures (such as so-called cross-pivots) or by normal rotary bearings (such as roller or ball bearings).

One of joints 126a, 126b, in this embodiment joint 126a, is arranged to be rigid against rotation (Rx) about an axis parallel to the X-direction so as to support X-beam 11 against pitch. The other, in this embodiment joint 126b, is arranged to provide considerable freedom for pitch movements between X-beam 11 and Y-slider 121b. This avoids any torsion forces in X-beam 11 which might otherwise be induced by deviations from parallel in the two Y-beams 12a, 12b. The Rx freedom in joint 126b is provided by a simple pivot, elastic or other means, between X-beam 11 and Y-slider 121b so that the two Y-sliders 121a, 121b are substantially identical and to ensure that encoder head 127b remains parallel to its linear grating 128b. An alternative to the pivot would be a vertical bearing arrangement which supports the Y-slider 121b on the side beam 12b which has load capacity in the vertical direction but negligible stiffness against pitch and roll.

To determine the positions of Y-sliders 121a, 121b, incremental encoders 127a, 127b and linear gratings 128a, 128b, mounted on Y-beams 12a, 12b, are provided. Incremental encoders 127a, 127b may conveniently be mounted on side bearings 123a, 123b and so will maintain their orientation relative to gratings 128a, 128b. Alternatively, they may be mounted on Y-sliders 121a, 121b and the cosine foreshortening caused by yaw movements of X-beam 11 compensated for by the provision of a mechanism such as a linear bearing or leaf spring arrangement.

For motor commutation purposes, it is necessary to know the Y-positions of Y-sliders 121a, 121b along the center lines of the motors. With encoders 127a, 127b mounted on side bearings 123a, 123b, the center line positions can be obtained directly by positioning pivots 124a, 124b exactly on the center lines. Alternatively, the center line positions can be obtained from a hardware or software interpolation algorithm, knowing the distances between the motor center points and the bearing pivot points. This alternative provides considerable additional flexibility in the mechanical layout of the side bearing arrangements.

Crash protection in the X and Y direction is provided by simple elastic (e.g. pre-loaded helical or conical springs) or viscous (e.g. hydraulic dampers) devices or a combination of the two.

Crash protection in yaw requires high moment loads on the whole positioning mechanism to be restrained by a system of forces acting between Y-sliders 121a, 121b and Y-beams 12a, 12b as the latter provide the only connection to the real world. To prevent excessive yaw correction forces in the X-direction causing side bearings 123a, 123b to be pulled away from their bearing surfaces, a yaw rate sensor 113 is provided on X-beam 11, X-slider 111 or wafer table WT. If a rate of yaw exceeding a preset safety limit is detected, a hardwired protection circuit is triggered to switch off all motors to prevent further increase in rotational kinetic energy. The rotational kinetic energy present prior to motor shutdown can be absorbed in a controlled crash via elastic and/or viscous dampers 114 mounted on X-beam 11 so as to engage the sides of Y-beams 12a, 12b.

Alternatively, the incremental encoders 127a, 127b and linear gratings 128a, 128b can be used to determine the yaw and the rate of yaw. If the yaw, the rate of yaw or a combination of both is detected which exceeds a pre-set safety limit all motors can be switched off to prevent a further increase of rotational energy.

Embodiment 2

Figure 5:
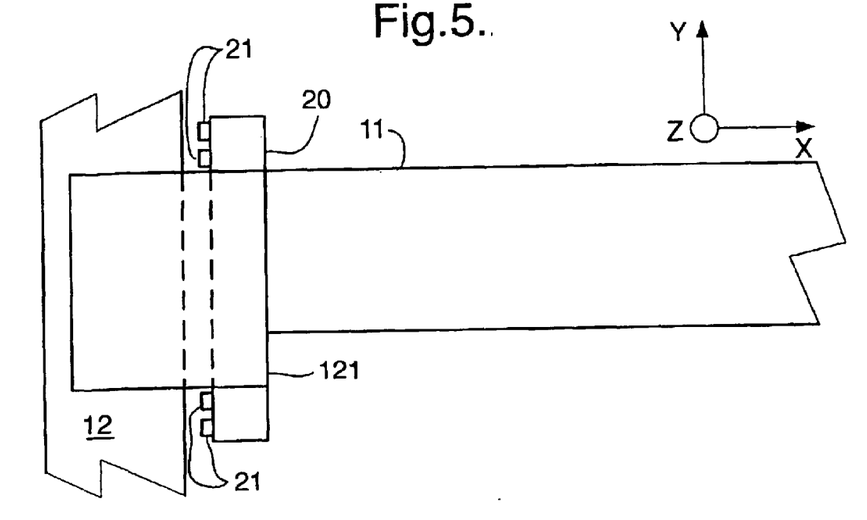
FIG. 5 is a plan view of a part of a wafer stage according to a second embodiment of the invention.
Figure 6:
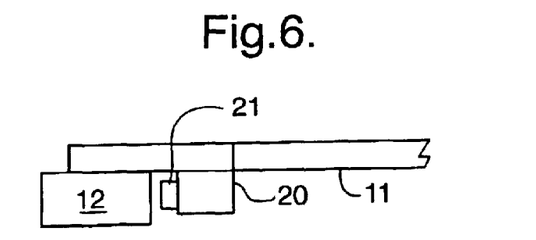
FIG. 6 is a side view of a part of the wafer stage of FIG. 5.
Figure 7:
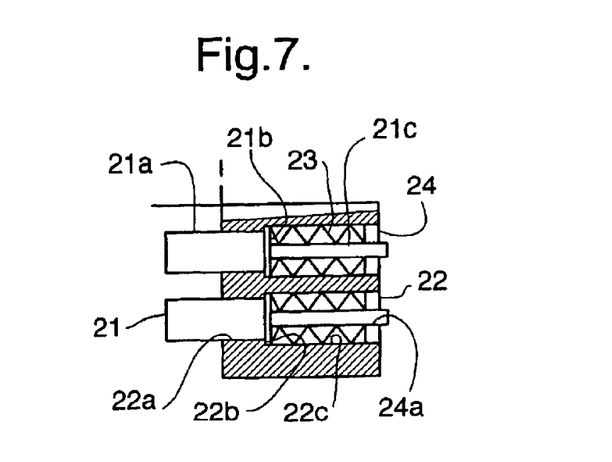
FIG. 7 is an enlarged, partly sectioned, view of crash pins in the wafer stage of FIG. 5.

FIGS. 5 to 7 show a part of a second embodiment of the invention which has additional arrangements for crash prevention. Only one side of the apparatus is shown; the other is similar. Parts not shown or not specifically described below may be similar to corresponding parts of the first embodiment.

As shown in FIGS. 5 and 6, a crash bar 20 is mounted below Y-slider 121 adjacent the connection to X-beam 11. Crash bar 20 extends in the Y-direction either side of X-beam 11 and carries at each end two crash pins 21. Crash pins 21 protrude from crash bar 20 towards Y-beam 12 and are positioned side by side in the Y-direction. In other embodiments they may be positioned one above the other or diagonally.

FIG. 7 is a partly cross-sectional enlarged view of two crash pins 21. It will be seen that each crash pin 21 comprises a generally cylindrical head portion 21a, a flange 21b provided around the proximal end of head portion 21a and a rod portion 21c extending coaxially with the head portion 21a away therefrom. A cylindrical bore 22 is provided through crash bar 20 for each crash pin 21. Each bore 22 extends generally in the X-direction and has a portion 22a of relatively small diameter adjacent Y-beam 12 joined by shoulder 22b to a portion 22c of relatively large diameter on the side away from Y-beam 12. Crash pin 21 is inserted into bore 22 from the side away from Y-beam 12 so that head portion 21a projects towards Y-beam 12 through portion 22a but is prevented from passing completely through bore 22 by engagement of flange 21b with shoulder 22b.

A resilient member 23, e.g. a helical spring, is provided around rod portion 21c and the end of bore 22 is closed by plug 24 which has a central through-hole 24a through which rod portion 21c projects. Resilient member 23 acts against plug 24 normally to urge pin 21 toward Y-beam 12. The uncompressed length of resilient member 23 and the dimensions of bore 21 are chosen to provide a desired pre-loading to the crash pin.

The dimensions of crash bar 20, the position of crash pins 21 and the protruding length of head portion 21a are chosen so that if the yaw of X-beam 11 exceeds a safe or permissible amount, the crash pins will come into contact with the side of Y-beam 12 before any other part of the yawing assembly, i.e X-beam 11, Y-sliders 121 and the other components mounted thereon, meets an obstacle. Crash pins 21 will be depressed by continued yawing of X-beam 11 against the resilience of resilient member 23 so that the crash pins act as buffers to provide a "soft-landing" for the yawing assembly.

Resilient member 23 may be substantially elastic or may include a significant amount of plasticity or friction to reduce rebound. Viscous or other forms of damper may also be included. The relative positions and lengths of the pins on each end of crash bar 20, the moduli of resilient members 23 and the degree of pre-loading provided may be varied so that the pins come into contact with Y-beam 12 simultaneously or sequentially and so as to provide uniform or progressive resistance to yaw once contact has been made.

Embodiment 3

Figure 10:
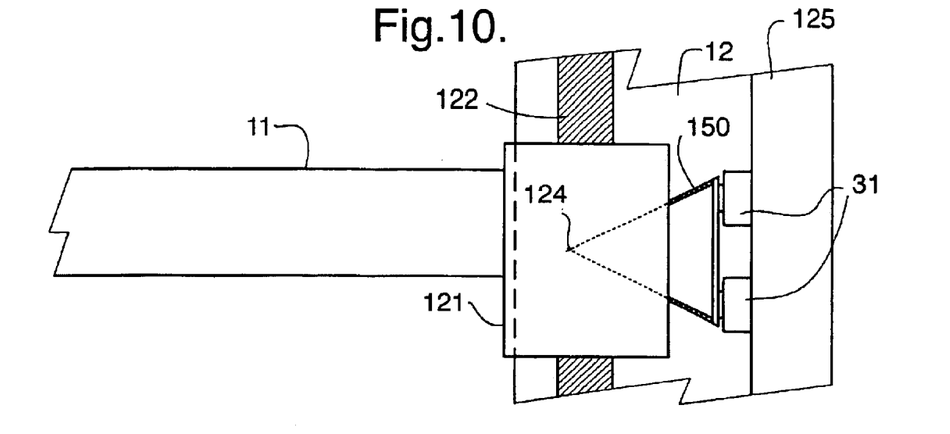
FIG. 10 is a plan view of a bearing arrangement used in a third embodiment of the invention.
Figure 11:
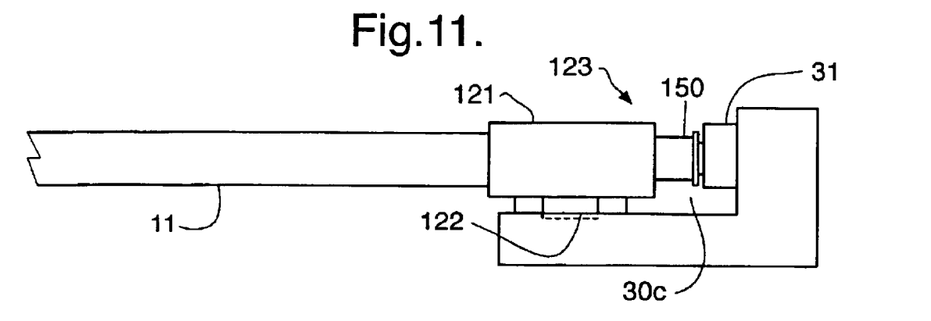
FIG. 11 is a side view of the bearing arrangement of FIG. 10.

FIGS. 10 and 11 show a third embodiment of the invention which differs from the first and second embodiments in the arrangement of the side thrust bearing. Only one side of embodiment 3 is shown, the other may be similar or may lack a side bearing or may include an X-translation mechanism to accommodate cosine fore-shortening, as discussed above. Parts not shown in FIGS. 10 and 11 or not specifically discussed below may be similar to corresponding parts in the first and second embodiments.

In embodiment 3, the side bearings 123 are connected to the Y-sliders 121 by a leaf-spring arrangement 150. The leaf springs comprised in arrangement 150 are generally vertical so as to be substantially rigid in Z and angled so that they define an effective, virtual pivot point 124'. Virtual pivot point 124' is preferably arranged so as be over the center line of the Y-motor track 122.

Embodiment 4

The fourth embodiment, which may be the same as any of the first to third embodiments save as described below, has a crash prevention mechanism 200, shown in FIGS. 12 to 14, which uses a torsion rod to absorb energy in the event of an excessive yaw motion.

Figure 12:
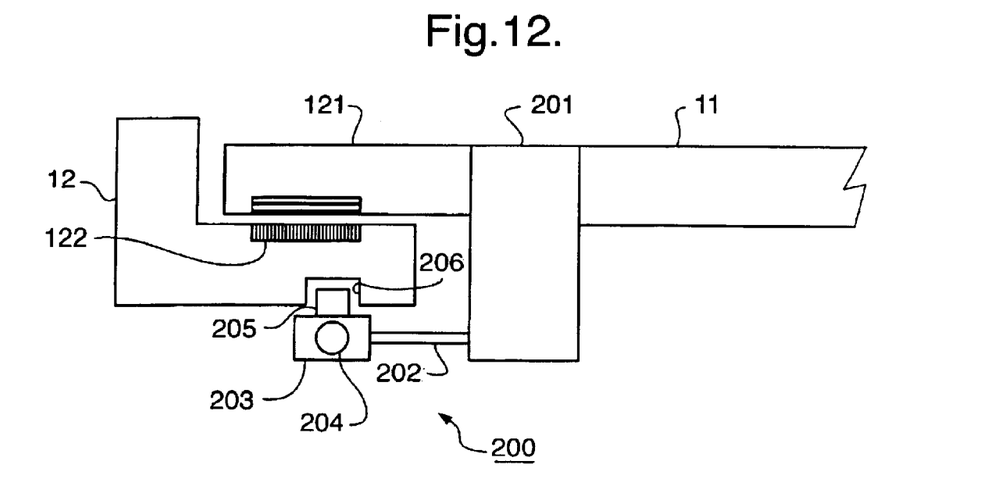
FIG. 12 is a side view of one end of the X-beam of a fourth embodiment of the invention showing a collision prevention mechanism.

As shown in FIG. 12, the X-beam 11 of the fourth embodiment is connected to Y-slider 121 via coupling member 201 which projects below the Y-beam 12. A framework 202 extends horizontally from coupling member 201 underneath Y-beam 12 to support a torsion rod 204 which is elongate in the Y-direction. Torsion rod 204 has a bearing 205 at each end; these bearings 205 are rigidly connected to the torsion rod and project into a groove 206 provided in the under surface of Y-beam 12.

Figure 13:
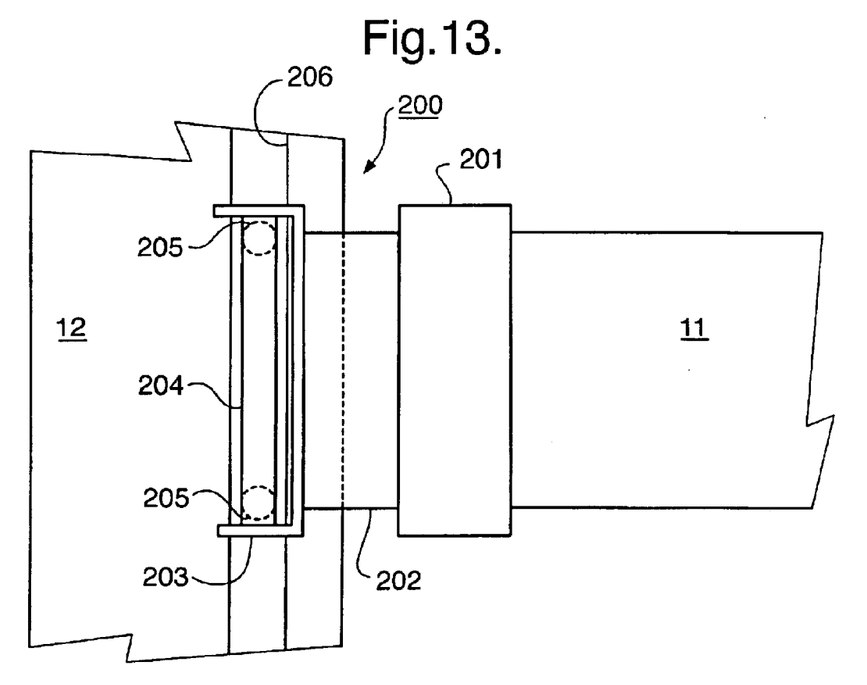
FIGS. 13 and 14 are underneath pan views of the end of the X-beam of the fourth embodiment in a normal and an excessive yaw position respectively.

When the yaw ($R_z$ position) of the X-beam 11 is within acceptable limits there is a clearance between the bearings 205 and the side walls of groove 206; this can be seen in FIG. 13. However, when the yaw of the X-beam 11 becomes excessive, the bearings 205 will come into contact with the side walls of groove 206 as shown in FIG. 14. Continued yawing R, of the X-beam 11 will cause reaction forces $F_1$, $F_2$ to be extended on the bearings 205. Reaction forces $F_1$, $F_2$ are in opposite directions and so a torque is extended on torsion rod 204. Torsion rod 204 is allowed to twist, at least to a limited degree, relative to framework 202, 203 and in doing so absorbs energy and counteracts the R, motion of the X-beam 11.

Figure 14:
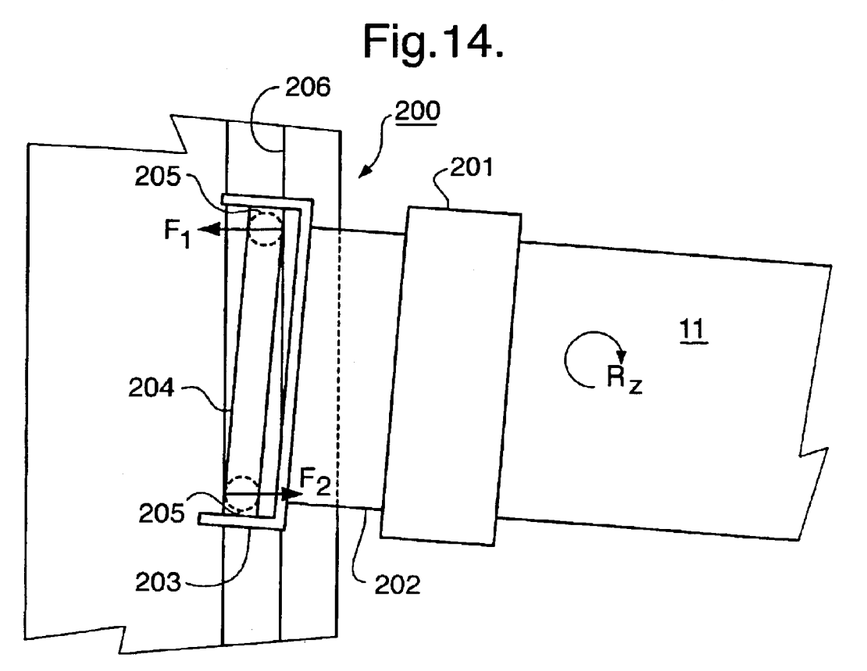

FIGS. 12 to 14 show a collision prevention mechanism 200 provided at one end of X-beam 11. Depending on the masses and yaw rates expected in use, a second similar collision prevention mechanism may also be provided at the other end.

In the various embodiments of the invention, it is preferable that the centers of gravity of the moving bodies, the lines of action of the various drive forces and the pivot points in the various couplings, all lie close, for example within ±20 mm, to a single XY plane.

While we have described above a specific embodiment of the invention it will be appreciated that the invention may be practiced otherwise than described. The description is not intended to limit the invention. In particular it will be appreciated that the invention may be used to position either or both mask and substrate tables of a lithographic apparatus.

What is claimed is:

1. A lithographic projection apparatus comprising:
  a patterning structure which can be used to pattern a projection beam according to a desired pattern;
  a substrate table constructed and arranged to support a substrate;
  a projection system constructed and arranged to image the patterned beam onto target portions of the substrate,
  an object table positioning system constructed and arranged to position at least one of said patterning structure and said substrate table in a plane, said object table positioning system including:
  a first side-beam having a first slider mounted thereon;
  a first motor that moves the first slider along the first side beam;
  a cross-beam mounted near a first end thereof to said first slider and having a second slider mounted thereon, said cross-beam and said first slider being mounted together so as to form a body that is substantially rigid in translation in said plane and in rotation about an axis normal to said plane, and said second slider having an object holder to hold the at least one of said patterning structure and said substrate table; and
  a thrust bearing pivotally mounted to said first slider, said thrust bearing transmitting a force in said plane and substantially perpendicular to said first side beam between said cross-beam and said first side beam.

2. A lithographic projection apparatus as recited in claim 1, wherein said object table positioning system further comprises a second motor that moves said second slider longitudinally to said cross-beam.

3. A lithographic projection apparatus as recited in claim 1, wherein said thrust bearing comprises a bearing assembly which acts against a bearing wall of said first side-beam.

4. A lithographic projection apparatus as recited in claim 3, wherein said bearing wall is substantially parallel to a longitudinal direction of said first side-beam.

5. A lithographic projection apparatus as recited in claim 3, wherein said bearing wall is substantially perpendicular to said plane.

6. A lithographic projection apparatus as recited in claim 3, wherein said bearing assembly is slideable against said bearing wall.

7. A lithographic projection apparatus as recited in claim 3, wherein said thrust bearing further comprises a support member constructed and arranged to carry the bearing assembly.

8. A lithographic projection apparatus as recited in claim 7, wherein said support member is connected to said first slider via a pivot.

9. A lithographic projection apparatus as recited in claim 8, wherein said support member comprises a central portion substantially parallel to said bearing wall, and a first distal end portion and a second distal end portion connected to said central portion, wherein each of said first distal portion and said second distal end portion has a far end opposite another end connected to said central portion, and wherein the far end of said first distal portion and the far end of said second distal end portion are connected to said pivot.

10. A lithographic projection apparatus as recited in claim 7, wherein said support member comprises a leaf-spring arrangement that is substantially rigid in a direction substantially perpendicular to said plane, said leaf-spring arrangement being connected to said first slider.

11. A lithographic projection apparatus as recited in claim 10, wherein said support member further comprises a central portion substantially parallel to said bearing wall, and a first distal end portion and a second distal end portion connected to said central portion, wherein said first distal end portion and said second distal end portion form said leaf-spring arrangement, and wherein said first distal end portion and said second distal end portion form an acute angle relative to said central portion such that an effective virtual pivot is created within said first slider.

12. A lithographic projection apparatus as recited in claim 11, wherein said virtual pivot is arranged over a center line of a motor track of said first slider.

13. A lithographic projection apparatus as recited in claim 3, wherein said bearing assembly comprises a plurality of bearing pads.

14. A lithographic projection apparatus as recited in claim 3, wherein the bearing assembly has a double-sided pad that acts on opposite faces of said bearing wall.

15. A lithographic projection apparatus as recited in claim 3, wherein said first motor comprises a linear motor having a stator mounted on said first side-beam and an armature mounted on said first slider, said stator comprising a magnet track arranged along a longitudinal direction of said first side-beam.

16. A lithographic projection apparatus as recited in claim 15, wherein said bearing wall extends substantially parallel along the track of said first side-beam.

17. A lithographic projection apparatus as recited in claim 16, wherein said object table positioning system further comprises a linear grating disposed along said magnet track and an incremental encoder disposed on one of said first slider and thrust bearing, said incremental encoder being configured to control said linear motor to drive said first slider to desired positions.

18. A lithographic projection apparatus as recited in claim 17, wherein said thrust bearing is pivotally mounted to said first slider with a pivot located substantially on a center line of said first track.

19. A lithographic projection apparatus comprising:
  a patterning structure which can be used to pattern a projection beam according to a desired pattern;
  a substrate table constructed and arranged to support a substrate;

a projection system constructed and arranged to image the patterned beam onto target portions of the substrate, an object table positioning system constructed and arranged to position at least one of said patterning structure and said substrate table in a plane, said object table positioning system including:

first and second side-beams having respective first and second sliders mounted thereon;

first and second motors that move said first and second sliders longitudinally to their respective side beams;

a cross-beam mounted near first and second ends thereof to said first and second sliders respectively and having a third slider mounted thereon, said cross-beam and said first and second sliders being mounted together so as to form a body that is substantially rigid in translation in said plane and in rotation about an axis normal to said plane, and said third slider having an object holder to hold the at least one of said patterning structure and said substrate table; and a thrust bearing pivotally mounted to said first slider, said thrust bearing comprising a bearing assembly which acts against a bearing wall of said first side-beam.

20. A lithographic projection apparatus as recited in claim 19, wherein said object table positioning system further comprises a third motor that moves said third slider longitudinally to said cross-beam.

21. A lithographic projection apparatus as recited in claim 19, further comprising a second thrust bearing pivotally mounted to said second slider, said second thrust bearing comprising a second bearing assembly which acts against a bearing wall of said second side-beam such that forces generated by translations of said third slider along said cross-beam are transmitted in said plane and perpendicular to said second side beam between said cross-beam and said second side beam.

22. A lithographic projection apparatus as recited in claim 19, wherein said cross-beam is mounted to said first slider with a first joint and to said second slider with a second joint, wherein one of said first joint and said second joint is arranged to be rigid against rotation about an axis substantially perpendicular to a longitudinal direction of said first and second side-beams, and wherein the other one of said first joint and said second joint is arranged to allow rotation about an axis substantially parallel to said longitudinal direction.

23. A method of manufacturing a device comprising:

irradiating portions of a mask and imaging said irradiated portions of the mask onto target portions of a substrate; and positioning one of a mask bearing moveable object table and a substrate bearing movable object table in a plane prior to or during said irradiating and imaging with a positioning apparatus including:

a first side-beam having a first slider mounted thereon;

a first motor that moves the first slider along the first side beam;

a cross-beam mounted near a first end thereof to said first slider and having a second slider mounted thereon, said cross-beam and said first slider being mounted together so as to form a body that is substantially rigid in translation in said plane and in rotation about an axis normal to said plane, and said second slider having an object holder to hold the at least one of said patterning structure and said substrate table; and a thrust bearing pivotally mounted to said first slider, said thrust bearing transmitting a force in said plane and substantially perpendicular to said first side beam between said cross-beam and said first side beam.

24. A device manufactured according to the method of claim 23.

25. A positioning apparatus for positioning a moveable object translationally and rotationally in a plane, the apparatus comprising:

a first side-beam having a first slider mounted thereon;

a first motor that moves the first slider along the first side beam;

a cross-beam mounted near a first end thereof to said first slider and having a second slider mounted thereon, said cross-beam and said first slider being mounted together so as to form a body that is substantially rigid in translation in said plane and in rotation about an axis normal to said plane, and said second slider having an object holder to hold the at least one of said patterning structure and said substrate table; and a thrust bearing pivotally mounted to said first slider, said thrust bearing transmitting a force in said plane and substantially perpendicular to said first side beam between said cross-beam and said first side beam.

* * * * *